(12) United States Patent
Osato

(10) Patent No.: US 12,114,523 B2
(45) Date of Patent: Oct. 8, 2024

(54) OPTICAL ANISOTROPIC LAYERED BODY, POLARIZING PLATE, AND IMAGE DISPLAY DEVICE

(71) Applicant: ZEON CORPORATION, Tokyo (JP)

(72) Inventor: Kazuhiro Osato, Tokyo (JP)

(73) Assignee: ZEON CORPORATION, Tokyo (JP)

(*) Notice: Subject to any disclaimer, the term of this patent is extended or adjusted under 35 U.S.C. 154(b) by 728 days.

(21) Appl. No.: 16/982,040

(22) PCT Filed: Mar. 11, 2019

(86) PCT No.: PCT/JP2019/009738
§ 371 (c)(1),
(2) Date: Sep. 18, 2020

(87) PCT Pub. No.: WO2019/188205
PCT Pub. Date: Oct. 3, 2019

(65) Prior Publication Data
US 2021/0020870 A1 Jan. 21, 2021

(30) Foreign Application Priority Data
Mar. 30, 2018 (JP) .................. 2018-069369

(51) Int. Cl.
- *G02F 1/1335* (2006.01)
- *G02B 5/30* (2006.01)
- *H10K 50/86* (2023.01)

(52) U.S. Cl.
CPC ........ *H10K 50/86* (2023.02); *G02B 5/3016* (2013.01); *G02B 5/305* (2013.01)

(58) Field of Classification Search
None
See application file for complete search history.

(56) References Cited

U.S. PATENT DOCUMENTS

2009/0040435 A1* 2/2009 Takahashi ........... G02F 1/13363
349/96
2009/0161045 A1 6/2009 Kawamoto et al.
(Continued)

FOREIGN PATENT DOCUMENTS

EP 2757394 A1 7/2014
JP 2002321302 A 11/2002
(Continued)

OTHER PUBLICATIONS

Oct. 6, 2020, International Preliminary Report on Patentability issued in the International Patent Application No. PCT/JP2019/009738.
(Continued)

*Primary Examiner* — Anthony J Frost
(74) *Attorney, Agent, or Firm* — KENJA IP LAW PC

(57) ABSTRACT

An optically anisotropic layered body including a first optically anisotropic layer and a second optically anisotropic layer, wherein the first optically anisotropic layer satisfies the following formula (1), the second optically anisotropic layer satisfies the following formula (2), and the optically anisotropic layered body satisfies the following formulae (3) and (4):

$nx1 \geq ny1 > nz1$      Formula (1), $ny2 < nx2 \leq nz2$      Formula (2), $Re(450) < Re(550) < Re(650)$      Formula (3), and $0 < NZ < 1.0$      Formula (4), wherein $nx1$, $ny1$, $nz1$, $nx2$, $ny2$, $nz2$, $Re(450)$, $Re(550)$, $Re(650)$ and NZ are as defined in the Specification.

5 Claims, 2 Drawing Sheets

(56) References Cited

U.S. PATENT DOCUMENTS

| | | | |
|---|---|---|---|
| 2011/0051062 A1* | 3/2011 | Sakai | G02B 5/3033 |
| | | | 349/120 |
| 2014/0268333 A1 | 9/2014 | Tanaka et al. | |
| 2015/0042943 A1 | 2/2015 | Hatanaka et al. | |
| 2015/0043071 A1 | 2/2015 | Hatanaka et al. | |
| 2015/0048339 A1 | 2/2015 | Kinohira et al. | |
| 2015/0079380 A1 | 3/2015 | Muramatsu et al. | |
| 2015/0168624 A1* | 6/2015 | Yaginuma | C08G 64/06 |
| | | | 359/489.07 |
| 2015/0219816 A1 | 8/2015 | Kinohira et al. | |
| 2015/0277006 A1 | 10/2015 | Takasago et al. | |
| 2015/0378079 A1 | 12/2015 | Takagi et al. | |
| 2016/0025913 A1 | 1/2016 | Oh et al. | |
| 2016/0216408 A1 | 7/2016 | Tanaka et al. | |
| 2017/0261668 A1* | 9/2017 | Hatano | G02B 5/3025 |
| 2018/0313990 A1 | 11/2018 | Muramatsu et al. | |
| 2020/0012147 A1 | 1/2020 | Osato et al. | |
| 2020/0088924 A1 | 3/2020 | Muramatsu et al. | |

FOREIGN PATENT DOCUMENTS

| | | |
|---|---|---|
| JP | 2011257610 A | 12/2011 |
| JP | 2013076982 A | 4/2013 |
| JP | 2014167922 A | 9/2014 |
| JP | 2015106114 A | 6/2015 |
| JP | 2015163935 A | 9/2015 |
| JP | 2015163936 A | 9/2015 |
| JP | 2015200861 A | 11/2015 |
| JP | 2016053709 A | 4/2016 |
| JP | 2017227790 A | 12/2017 |
| KR | 1020160012274 A | 2/2016 |
| KR | 1020170008478 A | 1/2017 |
| KR | 1020170055968 A | 5/2017 |
| TW | 200801731 A | 1/2008 |
| WO | 2013137113 A1 | 9/2013 |
| WO | 2014119457 A1 | 8/2014 |
| WO | 2016043124 A1 | 3/2016 |
| WO | 2018030244 A1 | 2/2018 |

OTHER PUBLICATIONS

Jun. 11, 2019, International Search Report issued in the International Patent Application No. PCT/JP2019/009738.

* cited by examiner

OPTICAL ANISOTROPIC LAYERED BODY, POLARIZING PLATE, AND IMAGE DISPLAY DEVICE

FIELD

The present invention relates to an optically anisotropic layered body, a polarizing plate, and an image display device.

BACKGROUND

An image display device such as an organic electroluminescent (hereinafter, also referred to as organic EL) image display device includes a film having optical anisotropy as an optical film. Various studies have heretofore been made on such an optical film (see Patent Literatures 1 to 6).

CITATION LIST

Patent Literature

Patent Literature 1: Japanese Patent Application Laid-Open No. 2014-167922 A
Patent Literature 2: Japanese Patent Application Laid-Open No. 2016-053709 A
Patent Literature 3: Japanese Patent Application Laid-Open No. 2015-106114 A
Patent Literature 4: Japanese Patent Application Laid-Open No. 2015-163935 A
Patent Literature 5: Japanese Patent Application Laid-Open No. 2015-163936 A
Patent Literature 6: Japanese Patent Application Laid-Open No. 2015-200861 A

SUMMARY

Technical Problem

The image display quality of an image display device may be reduced by reflection of outside light. Particularly, in the case of an organic EL image display device having a reflective electrode, reduction in image display quality is significant.

In order to suppress such reflection, a circularly polarizing plate may be provided on the display surface of the image display device. The term "circularly polarizing plate" used herein includes not only a circularly polarizing plate in a narrow sense but also an elliptically polarizing plate. Outside light is converted to circularly polarized light in a certain rotation direction by the circularly polarizing plate, and is then converted to circularly polarized light in a rotation direction that is opposite to the aforementioned certain direction when being reflected by the image display device. The reflected light in a state of circularly polarized light in the opposite rotation direction does not pass through the circularly polarizing plate, and therefore reflection is suppressed.

As the circularly polarizing plate provided on the display surface of the image display device, a layered body may be used which is obtained by layering a phase difference plate functioning as a λ/4 plate on a linear polarizer.

However, even when such a circularly polarizing plate is provided on the display surface of the image display device, coloring of the display surface is observed when the display surface is observed from an inclined direction because of visual recognition of light reflection on the display surface.

In order to reduce such coloring of the display surface viewed from an inclined direction, a layered body obtained by layering a positive C plate on a positive A plate as a λ/4 plate may be combined with a linear polarizer. Herein, the positive A plate refers to a film whose refractive indices nx, ny, and nz satisfy nx>ny≥nz, and the positive C plate refers to a film whose refractive indices nx, ny, and nz satisfy nz>nx≥ny.

The number of choices of a material for forming a positive C plate is small, and a liquid crystal compound having a forward wavelength dispersion property is usually used as a material for a positive C plate. A positive C plate using such a material has low heat resistance, and therefore the thickness-direction retardation Rth thereof may greatly change in a high-temperature environment. Therefore, in the case of an image display device having a circularly polarizing plate including a positive C plate, color tone change may occur when a display surface is observed from an inclined direction after a heating test. Further, the production cost for a positive C plate is generally high. For this reason, there is a demand for suppressing coloring of a display surface upon viewing from an inclined direction without necessity of the use of the positive C plate.

Therefore, there are still demands for an optically anisotropic layered body and a polarizing plate which are capable of achieving an image display device in which coloring of a display surface viewed from an inclined direction is suppressed, and for an image display device in which coloring of a display surface upon viewing from an inclined direction is suppressed.

Solution to Problem

In order to solve the above-described problem, the present inventor has intensively studied, and as a result has found that the above-described problem can be solved by an optically anisotropic layered body that includes a first optically anisotropic layer satisfying a specific optical requirement and a second optically anisotropic layer satisfying a specific optical requirement and that has specific retardations and a specific NZ factor. This finding has led to the completion of the present invention. Specifically, the present invention provides the following.

<1> An optically anisotropic layered body comprising a first optically anisotropic layer and a second optically anisotropic layer, wherein
the first optically anisotropic layer satisfies the following formula (1),
the second optically anisotropic layer satisfies the following formula (2), and
the optically anisotropic layered body satisfies the following formulae (3) and (4):

$$nx1 \geq ny1 > nz1 \qquad \text{Formula (1)},$$

$$ny2 < nx2 \leq nz2 \qquad \text{Formula (2)},$$

$$Re(450) < Re(550) < Re(650) \qquad \text{Formula (3), and}$$

$$0 < NZ < 1.0 \qquad \text{Formula (4)},$$

wherein
nx1 represents a refractive index in a direction in which a maximum refractive index is given among in-plane directions of the first optically anisotropic layer, ny1 represents a refractive index in another in-plane direction of the first optically anisotropic layer being orthogonal to the direction giving nx1, and nz1 represents a refractive index in a thickness direction of the first optically anisotropic layer, nx2 represents a refractive index in a direction in which a maximum refractive index is given among in-plane directions of the second optically anisotropic layer, ny2 represents a refractive index in another in-plane direction of the second optically anisotropic layer being orthogonal to the direction giving nx2, and nz2 represents a refractive index in a thickness direction of the second optically anisotropic layer, Re(450), Re(550), and Re(650) represent in-plane retardations Re of the optically anisotropic layered body at wavelengths of 450 nm, 550 nm, and 650 nm, respectively, and NZ represents an NZ factor of the optically anisotropic layered body.

<2> The optically anisotropic layered body according to <1>, wherein the second optically anisotropic layer includes a layer formed of a resin containing a polyphenylene ether and a polystyrene-based polymer having a syndiotactic structure.

<3> The optically anisotropic layered body according to <2>, wherein a weight ratio of the polyphenylene ether relative to the polystyrene-based polymer having a syndiotactic structure is 35/65 or more, and 45/55 or less.

<4> The optically anisotropic layered body according to any one of <1> to <3>, wherein the first optically anisotropic layer is a layer obtained by stretching a layer containing a resin having a positive intrinsic birefringence value.

<5> A polarizing plate comprising:

the optically anisotropic layered body according to any one of <1> to <4>; and a linear polarizer.

<6> An image display device comprising a linear polarizer, the optically anisotropic layered body according to any one of <1> to <4>, and an organic electroluminescent element in this order.

Advantageous Effects of Invention

According to the present invention, it is possible to provide: an optically anisotropic layered body and a polarizing plate which are capable of achieving an image display device in which coloring of a display surface upon viewing from an inclined direction is suppressed; and an image display device in which coloring of a display surface upon viewing from an inclined direction is suppressed.

DESCRIPTION OF EMBODIMENTS

Figure 1:
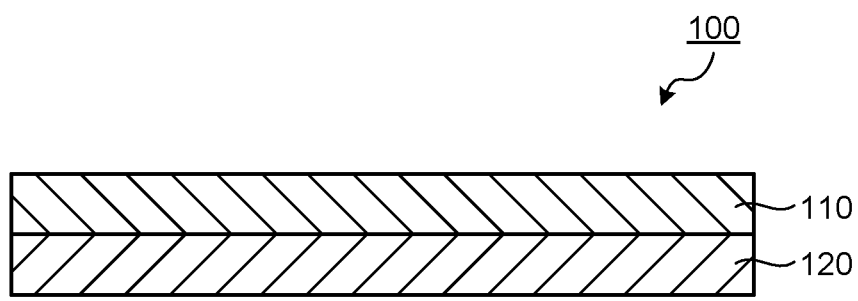
FIG. 1 is a cross-sectional view schematically showing an optically anisotropic layered body according to an embodiment of the present invention.

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, a "long-length" film refers to a film with the length that is 5 times or more the width, and preferably a film with the length that is 10 times or more the width, and specifically refers to a film having a length that allows a film to be wound up into a rolled shape for storage or transportation. The upper limit of the length of the long-length film is not particularly limited, and may be, for example, 100,000 times or less a width.

In the following description, an in-plane retardation Re of a certain layer is a value represented by $Re=(nx-ny)\times d$ unless otherwise specified. A thickness-direction retardation Rth of a certain layer is a value represented by $Rth=\{(nx+ny)/2-nz\}\times d$ unless otherwise specified. An NZ factor (NZ) of a certain layer is a value represented by $NZ=(nx-nz)/(nx-ny)$ unless otherwise specified. The NZ factor may be calculated by $NZ=Rth/Re+0.5$.

Herein, nx represents a refractive index in a direction in which the maximum refractive index is given among directions perpendicular to the thickness direction of the layer (in-plane directions), ny represents a refractive index in a direction, among the above-mentioned in-plane directions of the layer, orthogonal to the direction giving nx, nz represents a refractive index in the thickness direction of the layer, and d represents the thickness of the layer. The measurement wavelength is 590 nm unless otherwise specified.

In the following description, a slow axis of a certain layer is a slow axis in the surface of the layer unless otherwise specified.

Unless otherwise specified, in the following description, a front direction of a certain surface means the normal direction of the surface, and specifically refers to a direction at the polar angle 0° and the azimuth angle 0° of the certain surface.

Unless otherwise specified, in the following description, an inclined direction of a certain surface means a direction that is neither parallel nor perpendicular to the surface, and specifically refers to a direction in which the polar angle of the surface is in the range of more than 0° and less than 90°.

In the following description, a direction of an element being "parallel", "perpendicular" or "orthogonal" may allow an error within the range of not impairing the advantageous effects of the present invention, for example, within a range of ±5°, unless otherwise specified.

In the following description, a lengthwise direction of a long-length film is usually parallel to a direction in which the film travels in a production line.

In the following description, a "polarizing plate", a "circularly polarizing plate", a "plate", and a "phase difference plate" each include not only a rigid member but also a flexible member such as a resin film unless otherwise specified.

In the following description, an angle formed by an optical axis (e.g., a polarized light absorption axis, a polarized light transmission axis, a slow axis) of each layer in a member having a plurality of layers represents an angle when the layer is viewed from a thickness direction unless otherwise specified.

In the following description, a "polymer having a positive intrinsic birefringence value" and a "resin having a positive intrinsic birefringence value" mean a "polymer whose refractive index in a stretching direction is larger than that in a direction orthogonal to the stretching direction" and a "resin whose refractive index in a stretching direction is larger than that in a direction orthogonal to the stretching direction", respectively. Further, a "polymer having a negative intrinsic birefringence value" and a "resin having a negative intrinsic birefringence value" mean a "polymer whose refractive index in a stretching direction is smaller than that in a direction orthogonal to the stretching direction" and a "resin whose refractive index in a stretching direction is smaller than that in a direction orthogonal to the stretching direction", respectively. The intrinsic birefringence value may be calculated from a permittivity distribution.

In the following description, an adhesive agent includes not only an adhesive agent in a narrow sense (adhesive agent whose shear storage elastic modulus at 23° C. after energy ray irradiation or heating treatment is 1 MPa to 500 MPa) but also a tackiness agent whose shear storage elastic modulus at 23° C. is less than 1 MPa unless otherwise specified.

[1. Optically Anisotropic Layered Body]
[1-1. Structure of Optically Anisotropic Layered Body]

The optically anisotropic layered body according to an embodiment of the present invention includes a first optically anisotropic layer and a second optically anisotropic layer. FIG. 1 is a cross-sectional view schematically showing an optically anisotropic layered body according to an embodiment of the present invention. As shown in FIG. 1, an optically anisotropic layered body 100 according to the present embodiment includes a first optically anisotropic layer 110 and a second optically anisotropic layer 120. If necessary, the optically anisotropic layered body 100 may include an optional layer (not shown).

The first optically anisotropic layer 110 satisfies the formula (1), the second optically anisotropic layer 120 satisfies the formula (2), and the optically anisotropic layered body 100 satisfies the formula (3) and the formula (4).

By providing a circularly polarizing plate obtained by combining an optically anisotropic layered body having optical characteristics satisfying the formulae (1) to (4) with a linear polarizer in an image display device, reflection of outside light upon viewing the display surface of the image display device from an inclined direction is suppressed, and thereby coloring can effectively be suppressed.

$$nx1 \geq ny1 > nz1 \quad \text{Formula (1)}$$

$$ny2 < nx2 \leq nz2 \quad \text{Formula (2)}$$

$$Re(450) < Re(550) < Re(650) \quad \text{Formula (3)}$$

$$0 < NZ < 1.0 \quad \text{Formula (4)}$$

In the above-mentioned formula (1), nx1 represents a refractive index in a direction in which the maximum refractive index is given among in-plane directions of the first optically anisotropic layer, ny1 represents a refractive index in another in-plane direction of the first optically anisotropic layer being orthogonal to the direction giving nx1, and nz1 represents a refractive index in the thickness direction of the first optically anisotropic layer.

The above-mentioned formula (1) indicates that the first optically anisotropic layer may function as a so-called negative C plate or negative B plate.

Herein, nx1 and ny1 are preferably the same as or close to each other. Therefore, nx1, ny1, and nz1 of the first optically anisotropic layer preferably satisfy a relationship of nx1≈ny1>nz1. Specifically, a difference between nx1 and ny1 (nx1−ny1) is preferably 0.00000 to 0.00100, more preferably 0.00000 to 0.00050, and particularly preferably 0.00000 to 0.00020. When the difference in refractive index (nx1−ny1) falls within the above-described range, it is possible to achieve an image display device in which coloring caused by reflected light upon viewing the display surface from an inclined direction can be suppressed more effectively.

As a material of a layer satisfying the above-mentioned formula (1), a material having high heat resistance is known. Therefore, by using such a material as the material of the first optically anisotropic layer, it is possible to easily achieve an image display device in which the color tone change of a display surface after a heating test is suppressed. Further, a layer satisfying the above-mentioned formula (1) is generally lower in production cost than a positive C plate, and therefore the production cost for the optically anisotropic layered body according to the present embodiment including the first optically anisotropic layer can be kept low.

In the above-mentioned formula (2), nx2 represents a refractive index in a direction in which the maximum refractive index is given among in-plane directions of the second optically anisotropic layer, ny2 represents a refractive index in another in-plane direction of the second optically anisotropic layer being orthogonal to the direction giving nx2, and nz2 represents a refractive index in the thickness direction of the second optically anisotropic layer.

The above-mentioned formula (2) indicates that the second optically anisotropic layer may function as a so-called negative A plate or positive B plate. When the second optically anisotropic layer satisfies the formula (2), it is possible to achieve an image display device in which coloring caused by reflected light can be effectively suppressed.

In the above-mentioned formula (3), Re(450), Re(550), and Re(650) represent in-plane retardations Re of the optically anisotropic layered body at wavelengths of 450 nm, 550 nm, and 650 nm, respectively.

The above-mentioned formula (3) indicates that the in-plane retardation Re of the optically anisotropic layered body has a reverse wavelength dispersion property. When the optically anisotropic layered body satisfies the formula (3), the polarization state of light that passes through the optically anisotropic layered body can uniformly be changed in a wide wavelength range. Therefore, it is possible to achieve an image display device in which coloring caused by reflected light can be effectively suppressed in a wide wavelength range.

In the above-mentioned formula (4), NZ represents an NZ factor of the optically anisotropic layered body. The NZ factor of the optically anisotropic layered body is preferably 0.1 or more, and more preferably 0.2 or more, and is preferably 0.9 or less, and more preferably 0.8 or less.

When the NZ factor of the optically anisotropic layered body satisfies the above-mentioned range, it is possible to achieve an image display device in which coloring caused by reflected light upon viewing the display surface from an inclined direction can be effectively suppressed.

The in-plane retardation Re1 of the first optically anisotropic layer is usually 0 nm or more, preferably 0 nm or more and 10 nm or less, even more preferably 0 nm or more and 5 nm or less, even more preferably 0 nm or more and 3 nm or less. When the in-plane retardation Re1 of the first optically anisotropic layer falls within the above-described range, it is possible to achieve an image display device in which coloring caused by reflected light upon viewing the display surface from an inclined direction can be effectively suppressed.

It is preferable that the thickness-direction retardation $Rth1$ of the first optically anisotropic layer has a reverse wavelength dispersion property. Specifically, the first optically anisotropic layer preferably satisfies the following formula (5).

$$Rth1(450)<Rth1(550)<Rth1(650) \quad \text{Formula (5)}$$

In the above-mentioned formula (5), $Rth1(450)$, $Rth1(550)$, and $Rth1(650)$ represent thickness-direction retardations Rth of the first optically anisotropic layer at wavelengths of 450 nm, 550 nm, and 650 nm, respectively. When the first optically anisotropic layer satisfies the above-described formula, it is possible to achieve an image display device in which coloring caused by reflected light can be suppressed more effectively in a wide wavelength range.

The in-plane retardation $Re2$ of the second optically anisotropic layer is preferably 100 nm or more, more preferably 110 nm or more, and still more preferably 120 nm or more, and is preferably 180 nm or less, more preferably 170 nm or less, and even more preferably 160 nm or less. When the in-plane retardation $Re2$ of the second optically anisotropic layer falls within the above-described range, it is possible to achieve an image display device in which coloring caused by reflected light upon viewing the display surface from an inclined direction can be effectively suppressed.

It is preferable that the in-plane retardation $Re2$ of the second optically anisotropic layer has a reverse wavelength dispersion property. Specifically, the second optically anisotropic layer preferably satisfies the following formula (6).

$$Re2(450)<Re2(550)<Re2(650) \quad \text{Formula (6)}$$

In the above-mentioned formula (6), $Re2(450)$, $Re2(550)$, and $Re2(650)$ represent the in-plane retardations Re of the second optically anisotropic layer at wavelengths of 450 nm, 550 nm, and 650 nm, respectively.

When the second optically anisotropic layer satisfies the above-mentioned formula, it is possible to achieve an image display device in which coloring caused by reflected light can be more effectively suppressed in a wide wavelength range.

The total light transmittance of the first optically anisotropic layer is preferably 80% or more, more preferably 85% or more, and particularly preferably 90% or more, and may be 100% or less.

The total light transmittance of the second optically anisotropic layer is preferably 80% or more, more preferably 85% or more, and particularly preferably 90% or more, and may be 100% or less.

The haze of the first optically anisotropic layer is preferably 5% or less, more preferably 3% or less, particularly preferably 1% or less, and ideally 0%.

The haze of the second optically anisotropic layer is preferably 5% or less, more preferably 3% or less, particularly preferably 1% or less, and ideally 0%. The thickness of the first optically anisotropic layer and the thickness of the second optically anisotropic layer may be freely adjusted within the range in which the layers have the optical characteristics described above.

The thickness of the first optically anisotropic layer is preferably 0.5 μm or more, and more preferably 1 μm or more, and is preferably 150 μm or less, and more preferably 100 μm or less.

The thickness of the second optically anisotropic layer is preferably 0.5 μm or more, and more preferably 1 μm or more, and is preferably 150 μm or less, and more preferably 100 μm or less.

The total light transmittance of the optically anisotropic layered body is preferably 80% or more, more preferably 85% or more, and particularly preferably 90% or more, and may be 100% or less.

The haze of the optically anisotropic layered body is preferably 5% or less, more preferably 3% or less, particularly preferably 1% or less, and ideally 0%.

The thickness of the optically anisotropic layered body may be freely adjusted within the range in which the layered body has the above-mentioned optical characteristics. The specific thickness is preferably 3 μm or more, more preferably 4 μm or more, and particularly preferably 5 μm or more, and is preferably 20 μm or less, more preferably 15 μm or less, and particularly preferably 12 μm or less, from the viewpoint of thinning.

[1-2. Materials of First Optically Anisotropic Layer and Second Optically Anisotropic Layer]

Examples of the material for forming the first optically anisotropic layer and the second optically anisotropic layer may include resins, and among these, a thermoplastic resin is preferable.

The materials for forming the first optically anisotropic layer and the second optically anisotropic layer may be a resin containing a polymer having a positive intrinsic birefringence value, a resin containing a polymer having a negative intrinsic birefringence value, or a resin containing a polymer having a positive intrinsic birefringence value and a polymer having a negative intrinsic birefringence value.

Examples of the polymer having a positive intrinsic birefringence value may include, but are not particularly limited to, a polyolefin such as polyethylene and polypropylene; a polyester such as polyethylene terephthalate and polybutylene terephthalate; a polyarylene sulfide such as polyphenylene sulfide; a polyvinyl alcohol; a polycarbonate; a polyarylate; a cellulose ester; a polyethersulfone; a polysulfone; a polyarylsulfone; a polyvinylchloride; an alicyclic structure-containing polymer such as a norbornene polymer; and a rod-like liquid crystal polymer.

Examples of the polymer having a negative intrinsic birefringence value may include, but are not particularly limited to, a polystyrene-based polymer including a homopolymer of a styrene-based compound and a copolymer of a styrene-based compound with an optional monomer; a polyacrylonitrile polymer; a polymethylmethacrylate polymer; and a multi-component copolymer thereof. Examples of the optional monomer which may be copolymerized with the styrene-based compound may include acrylonitrile, maleic anhydride, methyl methacrylate, and butadiene. One type or more selected from acrylonitrile, maleic anhydride, methyl methacrylate, and butadiene are preferable.

The polymer may be a homopolymer or a copolymer.

As the above-described polymer, one type thereof may be solely used, and two or more types thereof may also be used in combination at any ratio.

The resin for forming the first optically anisotropic layer and the second optically anisotropic layer may contain an optional compounding agent in addition to the polymer. Examples of the compounding agent may include a stabilizer such as an antioxidant, a thermal stabilizer, a light stabilizer, a weather stabilizer, an ultraviolet absorber, and a near infrared absorber; and a plasticizer. As the compounding agent, one type thereof may be solely used, and two or more types thereof may also be used in combination at any ratio.

[1-3. Preferable Material of First Optically Anisotropic Layer]

The first optically anisotropic layer preferably includes a resin having a positive intrinsic birefringence value, and more preferably includes one type or more selected from a resin including an alicyclic structure-containing polymer, a resin including a cellulose ester, and a resin including a polycarbonate, and further preferably includes a resin including an alicyclic structure-containing polymer, a resin including a cellulose ester, or a resin including a polycarbonate. By using a resin having a positive intrinsic birefringence value as the material, the first optically anisotropic layer satisfying the formula (1) can be easily produced by biaxially stretching a film formed of the resin. Therefore, the first optically anisotropic layer is preferably a layer obtained by stretching a layer including a resin having a positive intrinsic birefringence value.

The alicyclic structure-containing polymer is a polymer having an alicyclic structure in the repeating units, and is usually an amorphous polymer. As the alicyclic structure-containing polymer, any of a polymer containing an alicyclic structure in a main chain and a polymer containing an alicyclic structure in a side chain may be used.

Examples of the alicyclic structure may include a cycloalkane structure and a cycloalkene structure, and a cycloalkane structure is preferable from the viewpoint of thermal stability or the like.

The number of carbon atoms constituting the repeating unit of one alicyclic structure is not particularly limited, and is preferably 4 or more, more preferably 5 or more, and particularly preferably 6 or more, and is preferably 30 or less, more preferably 20 or less, and particularly preferably 15 or less.

The ratio of the repeating unit having the alicyclic structure in the alicyclic structure-containing polymer may be appropriately selected depending on the purpose of use application, and is preferably 50 by weight or more, more preferably 70% by weight or more, and particularly preferably 90 by weight or more, and may be 100% by weight or less. By having a large amount of the repeating units having an alicyclic structure as described above, heat resistance of the first optically anisotropic layer can be increased.

Examples of the alicyclic structure-containing polymer may include (1) a norbornene polymer, (2) a monocyclic olefin polymer, (3) a cyclic conjugated diene polymer, (4) a vinyl alicyclic hydrocarbon polymer, and hydrogenated products thereof. Among these, a norbornene polymer is more preferable from the viewpoints of transparency and moldability.

Examples of the norbornene polymer may include a ring-opening polymer of a norbornene monomer, a ring-opening copolymer of a norbornene monomer and another monomer ring-opening copolymerizable therewith, and a hydrogenated product thereof; and an addition polymer of a norbornene monomer, an addition copolymer of a norbornene monomer and another monomer copolymerizable therewith. Among these, from the viewpoint of transparency, a hydrogenated product of a ring-opening polymer of a norbornene monomer is particularly preferable.

The alicyclic structure-containing polymer is selected from publicly known polymers disclosed in, for example, Japanese Patent Application Laid-Open No. 2002-321302 A and the like.

Representative examples of the cellulose ester may include lower fatty acid esters of cellulose (for example, cellulose acetate, cellulose acetate butyrate, and cellulose acetate propionate). The term "lower fatty acid" means a fatty acid of 6 or fewer carbon atoms per molecule. Examples of the cellulose acetates may include triacetyl cellulose (TAC) and cellulose diacetate (DAC).

The total degree of acyl group substitution of the cellulose ester is preferably 2.20 or more and 2.70 or less, and more preferably 2.40 or more and 2.60 or less. Herein, the total acyl group may be measured in accordance with ASTM D817-91.

The weight-average polymerization degree of the cellulose ester is preferably 350 or more and 800 or less, and more preferably 370 or more and 600 or less. The number-average molecular weight of the cellulose ester is preferably 60,000 or more and 230,000 or less, and more preferably 70,000 or more and 230,000 or less.

Examples of the polycarbonate may include a polymer having a structural unit derived from a dihydroxy compound and a carbonate structure (a structure represented by —O—(C=O)—O—).

Examples of the dihydroxy compound may include bisphenol A. The structural units derived from a dihydroxy compound contained in the polycarbonate may be one type or two or more types.

It is more preferable that the first optically anisotropic layer includes a resin containing triacetyl cellulose. Since the retardation of a film formed of a resin containing triacetyl cellulose generally has a reverse wavelength dispersion property, it is therewith possible to achieve an image display device in which coloring caused by reflected light can be suppressed more effectively in a wide wavelength range.

When the first optically anisotropic layer is formed of a resin containing triacetyl cellulose, it is preferable that the first optically anisotropic layer is a layer formed by a solution casting method. It is thereby possible to easily produce the first optically anisotropic layer satisfying the formula (1).

[1-4. Preferable Material of Second Anisotropic Layer]

The second optically anisotropic layer preferably includes a resin containing a polymer having a negative intrinsic birefringence value, more preferably includes a resin containing a polyphenylene ether and a polystyrene-based polymer having a syndiotactic structure, and still more preferably includes a layer formed of a resin containing a polyphenylene ether and a polystyrene-based polymer having a syndiotactic structure, as employment thereof enables increase of the thickness-direction refractive index of the second optically anisotropic layer. Hereinafter, a "resin containing a polyphenylene ether and a polystyrene-based polymer having a syndiotactic structure" may be referred to as a "blend resin p1" as appropriate.

The signs (positivity and negativity) of the intrinsic birefringence value of the blend resin p1 can be adjusted as that is affected by the type and amount of the polymer included in the blend resin p1. Usually, a blend resin having a negative intrinsic birefringence value is used as the blend resin p1. In the blend resin p1, the wavelength dispersion of the blend resin p1 can be adjusted with a high degree of freedom by adjusting the amount ratio of the polyphenylene ether and the polystyrene-based polymer.

The polyphenylene ether is usually a polymer having a positive intrinsic birefringence value. The polyphenylene ether includes a structural unit having a structure formed by polymerizing a phenyl ether or a phenyl ether derivative. Usually, a polymer having a structural unit having a phenylene ether skeleton in its main chain is used as the polyphenylene ether. Hereinafter, a "structural unit having a phenylene ether skeleton" is referred to as a "phenylene ether unit" as appropriate. However, the benzene ring in the phenylene ether unit may have a substituent as long as the advantageous effect of the present invention is not significantly impaired.

Among these, as the polyphenylene ether, a polymer containing a phenylene ether unit represented by the following formula (I) is preferable.

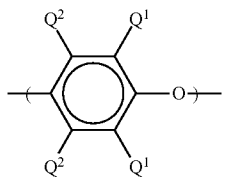

In the formula (I), $Q^1$'s each independently represent a halogen atom, a lower alkyl group (for example, an alkyl group of 7 or fewer carbon atoms), a phenyl group, a haloalkyl group, an aminoalkyl group, a hydrocarbon oxy group, or a halohydrocarbon oxy group (with a proviso that at least two carbon atoms separate the halogen atom and the oxygen atom). Among these, as $Q^1$, an alkyl group and a phenyl group are preferable, and in particular, an alkyl group of 1 to 4 carbon atoms is more preferable.

In the formula (I), $Q^2$'s each independently represent a hydrogen atom, a halogen atom, a lower alkyl group (for example, an alkyl group of 7 or fewer carbon atoms), a phenyl group, a haloalkyl group, a hydrocarbon oxy group, or a halohydrocarbon oxy group (with a proviso that at least two carbon atoms separate the halogen atom and the oxygen atom). Among these, a hydrogen atom is preferable as $Q^2$.

The polyphenylene ether may be a homopolymer having one type of structural unit or a copolymer having two or more types of structural units.

When the polymer containing the structural unit represented by the formula (I) is a homopolymer, preferable examples of the homopolymer may include a homopolymer having a 2,6-dimethyl-1,4-phenylene ether unit (a structural unit represented by "—$(C_6H_2(CH_3)_2$—O)—").

When the polymer containing the structural unit represented by the formula (I) is a copolymer, preferable examples of the copolymer may include a random copolymer having a 2,6-dimethyl-1,4-phenylene ether unit and a 2,3,6-trimethyl-1,4-phenylene ether unit (a structural unit represented by "—$(C_6H(CH_3)_3$—O—)—")).

The polyphenylene ether may contain an optional structural unit other than the phenylene ether unit. In this case, the polyphenylene ether is a copolymer having the phenylene ether unit and the optional structural unit. However, it is preferable that the amount of the optional structural unit in the polyphenylene ether is small to the extent that the advantageous effect of the present invention is not significantly impaired. Specifically, the amount of the phenylene ether unit in the polyphenylene ether is preferably 50% by weight or more, more preferably 70% by weight or more, and particularly preferably 80% by weight or more, and may be 100% by weight or less.

As the polyphenylene ether, one type thereof may be solely used, and two or more types thereof may also be used in combination at any ratio.

The weight-average molecular weight of the polyphenylene ether is preferably 15,000 or more, more preferably 25,000 or more, and particularly preferably 35,000 or more, and is preferably 100,000 or less, more preferably 85,000 or less, and particularly preferably 70,000 or less. By setting the weight-average molecular weight to be equal to or higher than the lower limit value of the above-described range, the strength of the layer formed of the blend resin p1 can be increased. By setting the weight-average molecular weight to be equal to or lower than the upper limit value, the dispersibility of the polyphenylene ether can be enhanced. Thus, it is possible to uniformly mix the polyphenylene ether and the polystyrene-based polymer at a high level.

Herein, the weight-average molecular weight may be a standard polystyrene-equivalent value measured by gel permeation chromatography (GPC) at a temperature of 135° C. using 1,2,4-trichlorobenzene as a solvent.

There is no limitation on the method for producing the polyphenylene ether, and the polyphenylene ether may be produced by any publicly known method.

The polystyrene-based polymer having a syndiotactic structure is usually a polymer having a negative intrinsic birefringence value. The polystyrene-based polymer contains a structural unit formed by polymerizing a styrene-based compound. Hereinafter, a "structural unit formed by polymerizing a styrene-based compound" is referred to as a "styrene-based unit" as appropriate. Examples of the styrene-based compound may include styrene and a styrene derivative. Examples of the styrene derivative may include derivatives in which a substituent is substituted in the benzene ring of styrene or at an α position thereof.

Specific examples of the styrene-based compound may include styrene; alkylstyrene such as methylstyrene and 2,4-dimethylstyrene; a halogenated styrene such as chlorostyrene; a halogen-substituted alkylstyrene such as chloromethylstyrene; and alkoxystyrene such as methoxystyrene. Among these, styrene having no substituent is preferable as the styrene-based compound. As the styrene compound, one type thereof may be solely used, and two or more types thereof may also be used in combination at any ratio.

As the polystyrene-based polymer included in the blend resin p1, a polymer having a syndiotactic structure is used. Herein, the phrase "the polystyrene-based polymer has a syndiotactic structure" means that the stereochemical structure of the polystyrene-based polymer is a syndiotactic structure. The syndiotactic structure refers to a steric structure in which phenyl groups, which are side chains, are alternately positioned in opposite directions about a main chain formed by a carbon-carbon bond in Fisher projection formula.

Tacticity (stereoregularity) of the polystyrene-based polymer may be quantified by a nuclear magnetic resonance method with isotope carbons ($^{13}$C-NMR method). The tacticity measured by the $^{13}$C-NMR method may be indicated by the abundance ratio of a plurality of successive structural units. Generally, for example, two consecutive structural units is referred to as a diad, three consecutive structural units a triad, and five consecutive structural units a pentad. In this case, the polystyrene-based polymer having the syndiotactic structure means a polymer having a syndiotacticity of preferably 75% or more, more preferably 85% or more, in terms of racemic diad, or a polymer having a syndiotacticity of preferably 30% or more, more preferably 50% or more in terms of racemic pentad.

Examples of the polystyrene-based polymer may include a polystyrene, a poly(alkylstyrene), a poly(halogenated styrene), a poly(halogenated alkylstyrene), a poly(alkoxystyrene), a poly(benzoic acid vinyl ester), and hydrogenated polymers thereof, and copolymers thereof.

Examples of the poly(alkylstyrene) may include a poly(methylstyrene), a poly(ethylstyrene), a poly(isopropylstyrene), a poly(t-butylstyrene), a poly(phenylstyrene), a poly(vinyl naphthalene), and a poly(vinylstyrene).

Examples of the poly(halogenated styrene) may include a poly(chlorostyrene), a poly(bromostyrene), and a poly(fluorostyrene).

Examples of the poly(halogenated alkylstyrene) may include a poly(chloromethylstyrene).

Examples of the poly(alkoxystyrene) may include a poly(methoxystyrene), and a poly(ethoxy styrene). Particularly preferable examples of the polystyrene-based polymer may include a polystyrene, a poly(p-methylstyrene), a poly(m-methylstyrene), a poly(p-t-butylstyrene), a poly(p-chlorostyrene), a poly(m-chlorostyrene), a poly(p-fluorostyrene), a hydrogenated polystyrene, and a copolymer containing these structural units.

The polystyrene-based polymer may be a homopolymer having only one type of structural unit or a copolymer having two or more types of structural units. When the polystyrene-based polymer is a copolymer, it may be a copolymer containing two or more types of styrene-based units, or may be a copolymer containing a styrene-based unit and a structural unit other than the styrene-based unit. However, when the polystyrene-based polymer is a copolymer containing a styrene-based unit and a structural unit other than the styrene-based unit, it is preferable to reduce the amount of the structural unit other than the styrene-based unit in the polystyrene-based polymer to such an extent that the advantageous effects of the present invention are not significantly impaired. Specifically, the amount of the styrene-based unit in the polystyrene-based polymer is preferably 80% by weight or more, more preferably 83% by weight or more, and particularly preferably 85 by weight or more, and may be 100% by weight or less. Usually, by setting the amount of the styrene-based unit to fall within such a range, a desired phase difference can be easily exhibited in the layer formed of the blend resin p1.

As the polystyrene-based polymer, one type thereof may be solely used, and two or more types thereof may also be used in combination at any ratio.

The weight-average molecular weight of the polystyrene-based polymer is usually 130,000 or more, preferably 140,000 or more, and more preferably 150,000 or more, and is usually 300,000 or less, preferably 270,000 or less, and more preferably 250,000 or less. When the weight-average molecular weight is set to fall within such a range, the glass transition temperature of the polystyrene-based polymer is increased, and heat resistance of the layer formed of the blend resin p1 can be stably improved.

The glass transition temperature of the polystyrene-based polymer is preferably 85° C. or higher, more preferably 90° C. or higher, and particularly preferably 95° C. or higher. By increasing the glass transition temperature of the polystyrene-based polymer in this manner, the glass transition temperature of the blend resin p1 can be effectively increased, and thus heat resistance of the layer formed of the blend resin p1 can be stably improved. From the viewpoint of stably and easily producing the layer formed of the blend resin p1, the glass transition temperature of the polystyrene-based polymer is preferably 160° C. or lower, more preferably 155° C. or lower, and particularly preferably 150° C. or lower.

The polyphenylene ether and the polystyrene-based polymer included in the blend resin p1 are (i) different in wavelength dispersion from each other, (ii) different in sign of the intrinsic birefringence value, and (iii) compatible with each other. Therefore, by adjusting the weight ratio between the amount of polyphenylene ether and the amount of polystyrene-based polymer, the wavelength dispersion of the layer formed of the blend resin p1 can be adjusted. The weight ratio of the polyphenylene ether relative to the polystyrene-based polymer ("amount of polyphenylene ether"/"amount of polystyrene-based polymer") is preferably 35/65 or more, and more preferably 37/63 or more, and is preferably 45/55 or less, and more preferably 43/57 or less. By setting the weight ratio of the polyphenylene ether relative to the polystyrene-based polymer to fall within the above-described range, the layer formed of the blend resin p1 can exhibit a preferable reverse wavelength dispersibility.

The ratio of the total of the polyphenylene ether and the polystyrene-based polymer in the blend resin p1 is preferably 50% to 100% by weight, more preferably 70% to 100% by weight, and particularly preferably 90% to 100% by weight. By setting the ratio of the total of the polyphenylene ether and the polystyrene-based polymer to fall within the above-described range, the layer formed of the blend resin p1 can exhibit appropriate optical characteristics.

The blend resin p1 may include an optional component other than the polyphenylene ether and the polystyrene-based polymer.

For example, the blend resin p1 may contain a polymer other than the above-mentioned polyphenylene ether and polystyrene-based polymer. The amount of the polymer other than the polyphenylene ether and the polystyrene-based polymer is preferably 15 parts by weight or less, more preferably 10 parts by weight or less, and particularly preferably 5 parts by weight or less, relative to the total amount of the polyphenylene ether and the polystyrene-based polymer being 100 parts by weight.

For example, the blend resin p1 may include a compounding agent. Examples of the compounding agent may include a layered crystalline compound; fine particles; a stabilizer such as an antioxidant, a thermal stabilizer, a light stabilizer, a weather stabilizer, an ultraviolet absorber, and a near infrared absorber; a plasticizer; a colorant such as a dye and a pigment; and an antistatic agent. As the compounding agent, one type thereof may be solely used, and two or more types thereof may also be used in combination at any ratio.

The amount of the compounding agent may be appropriately determined within a range that does not significantly impair the advantageous effects of the present invention. For example, the amount may be in the range within which the total light transmittance of the layer formed of the blend resin p1 can be maintained at 85% or more.

The glass transition temperature of the blend resin p1 is preferably 115° C. or higher, more preferably 118° C. or higher, and even more preferably 120° C. or higher. Since the blend resin p1 includes a combination of the polyphenylene ether and the polystyrene-based polymer, the glass transition temperature can be increased as compared with a resin including only the polystyrene-based polymer. By having such a high glass transition temperature, orientation relaxation of the blend resin p1 can be reduced, and thereby the second optically anisotropic layer having excellent heat resistance can be realized. The upper limit of the glass transition temperature of the blend resin p1 is not particularly limited, and is usually 200° C. or lower.

[1-5. Method for Producing First Optically Anisotropic Layer and Second Optically Anisotropic Layer]

The first optically anisotropic layer and the second optically anisotropic layer may be produced by a method that is publicly known in prior art. Examples of the method for producing the first optically anisotropic layer and the second optically anisotropic layer may include a melt molding method and a solution casting method.

As the method for producing the first optically anisotropic layer and the second optically anisotropic layer, a melt molding method is preferable from the viewpoint of suppressing the volatile component such as a solvent from remaining in the layer. The melt molding method may be further classified into an extrusion molding method, a press molding method, an inflation molding method, an injection molding method, a blow molding method, and a stretch molding method. Among these methods, in order to obtain a layer having excellent mechanical strength and surface accuracy, an extrusion molding method, an inflation molding method, and a press molding method are preferable, and an extrusion molding method is particularly preferable from the viewpoint that the first optically anisotropic layer and the second optically anisotropic layer can be produced efficiently and easily.

As described above, when the first optically anisotropic layer is formed of a resin containing triacetyl cellulose, the first optically anisotropic layer is preferably formed by a solution casting method. Thus, it is possible to easily produce the first optically anisotropic layer satisfying the formula (1).

In the solution casting method, casting of two or more layers may be performed. For example, two or more types of solutions containing triacetylcellulose may be prepared, and the first optically anisotropic layer formed of a resin layer containing two or more types of triacetylcellulose may be produced by a casting machine having two or more casting ports.

The first optically anisotropic layer and the second optically anisotropic layer may be produced by different methods. For example, the first optically anisotropic layer may be produced by a solution casting method, and the second optically anisotropic layer may be produced by a melt molding method.

The film obtained by the above-described method may be used as the first optically anisotropic layer or the second optically anisotropic layer after being stretched by a stretching method such as uniaxial stretching, simultaneous biaxial stretching, or sequential biaxial stretching. The stretching conditions such as stretching ratio, stretching temperature, and the like may be freely set depending on the optical characteristics required for each of the first optically anisotropic layer and the second optically anisotropic layer.

For example, the first optically anisotropic layer may be formed by biaxially stretching an unstretched film that has been produced by a melt molding method or the like. For example, the second optically anisotropic layer may be formed by uniaxially stretching an unstretched film that has been produced by a melt molding method or the like.

For example, when the second optically anisotropic layer is formed by uniaxial stretching of the unstretched film, the stretching direction may be any of the flow direction of the film (conveying direction), the lateral direction orthogonal to the conveying direction, and an oblique direction that is neither parallel nor orthogonal to the conveying direction.

[1-6. Method for Producing Optically Anisotropic Layered Body]

The optically anisotropic layered body may be produced by, for example, bonding the first optically anisotropic layer and the second optically anisotropic layer that have been produced by the above-described method. An appropriate adhesive agent may be used for bonding. As the adhesive agent, for example, an adhesive agent that is the same as the adhesive agent that can be used for producing the polarizing plate described below may be used.

[2. Polarizing Plate]

Figure 2:
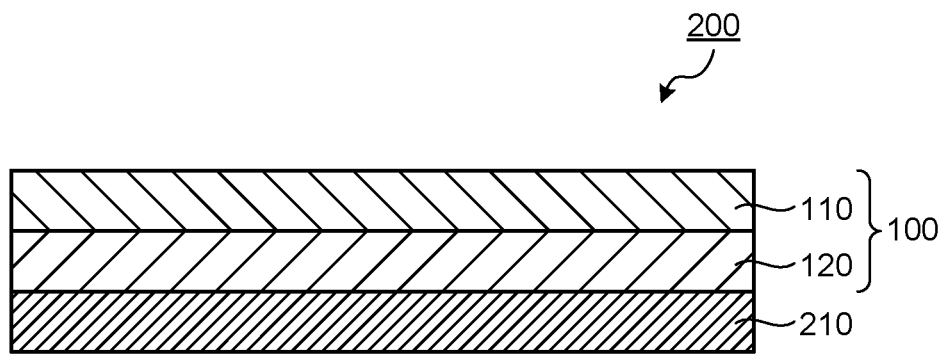
FIG. 2 is a cross-sectional view schematically showing a polarizing plate according to an embodiment of the present invention.

FIG. 2 is a cross-sectional view schematically showing a polarizing plate according to an embodiment of the present invention.

As shown in FIG. 2, the polarizing plate 200 includes the linear polarizer 210 and the optically anisotropic layered body 100. Such a polarizing plate 200 can usually function as a circularly polarizing plate. Thus, when the polarizing plate 200 is provided on the display surface of the image display device, it is possible to suppress the reflection of the outside light. In particular, according to the polarizing plate 200 including the optically anisotropic layered body 100, it is possible to suppress, upon viewing the display surface from the inclined direction, the reflection of the outside light, and effectively suppress the coloring.

The polarizing plate 200, the linear polarizer 210, the first optically anisotropic layer 110, and the second optically anisotropic layer 120 may be provided in this order. However, from the viewpoint of effectively suppressing the reflection of outside light in the inclined direction, it is preferable to include the linear polarizer 210, the second optically anisotropic layer 120, and the first optically anisotropic layer 110 in this order, as shown in FIG. 2.

As the linear polarizer 210, any optional linear polarizer may be used. Examples of the linear polarizer may include a film obtained by causing a polyvinyl alcohol film to adsorb iodine or a dichroic dye, followed by uniaxial stretching in a boric acid bath; and a film obtained by causing a polyvinyl alcohol film to adsorb iodine or a dichroic dye, and stretching the film and modifying a portion of the polyvinyl alcohol units in the molecular chain to a polyvinylene unit. Other examples of the linear polarizer may include a polarizer that has a function of separating polarized light into reflected and transmitted light, such as a grid polarizer, a multilayer polarizer, and a cholesteric liquid crystal polarizer. Of these, a polarizer containing polyvinyl alcohol is preferable as the linear polarizer 210.

When natural light is made incident on the linear polarizer 210, only one polarized light passes therethrough. The degree of polarization of the linear polarizer 210 is not particularly limited, and is preferably 98% or more, and more preferably 99% or more.

The thickness of the linear polarizer 210 is preferably 5 μm to 80 μm.

The polarizing plate may further include an adhesive layer for bonding the linear polarizer 210 and the optically anisotropic layered body 100. As the adhesive layer, a tackiness layer formed of a tacky adhesive agent may be used, or a layer made by curing a curable adhesive agent may be used. As the curable adhesive agent, although a thermosetting adhesive agent may be used, it is preferable to use a photocurable adhesive agent. The photocurable adhesive agent used may include a polymer or a reactive monomer. The adhesive agent may contain a solvent, a photopolymerization initiator, other additives, and the like if necessary.

The photocurable adhesive agent is an adhesive agent that can be cured by irradiation with light such as visible light, ultraviolet light, or infrared light. Among these, an adhesive agent that can be cured by ultraviolet rays is preferable because of simple operation.

The thickness of the adhesive layer is preferably 0.5 μm or more, and more preferably 1 μm or more, and is preferably 30 μm or less, more preferably 20 μm or less, and still more preferably 10 μm or less. By setting the thickness of the adhesive layer to fall within the above-described range, good adhesion can be achieved without impairing the optical properties of the optically anisotropic layer.

In the polarizing plate, the angle formed by the slow axis of the optically anisotropic layered body 100 with respect to the polarization absorption axis of the linear polarizer 210 is preferably 45° or an angle close thereto, and specifically, is preferably 45°±5°, more preferably 45°±4°, and particularly preferably 45°±3°.

The above-described polarizing plate may further include an optional layer. Examples of the optional layer may include a polarizer protective film layer, a hard coat layer such as an impact resistant polymethacrylate resin layer, a matte layer for improving the slippery property of the film, a reflection suppression layer, an antifouling layer, and an electric charge suppression layer. One of these optional layers may be provided, and two or more layers may also be provided.

The polarizing plate may be produced by bonding a linear polarizer and the optically anisotropic layered body together using an adhesive agent if necessary.

[3. Image Display Device]

Figure 3:
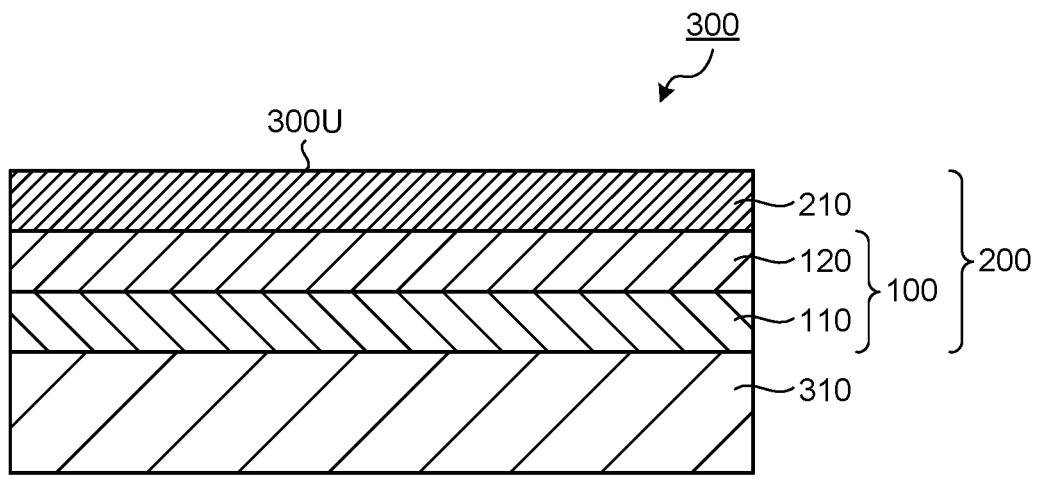
FIG. 3 is a cross-sectional view schematically showing an image display device according to an embodiment of the present invention.

FIG. 3 is a cross-sectional view schematically showing an image display device 300 according to an embodiment of the present invention.

As shown in FIG. 3, the image display device 300 includes the polarizing plate 200 and an organic electroluminescent element (hereinafter, sometimes referred to as an "organic EL display element") 310. The image display device 300 usually includes the linear polarizer 210, the optically anisotropic layered body 100, and the organic EL display element 310, in this order.

The image display device 300 may include the linear polarizer 210, the first optically anisotropic layer 110, the second optically anisotropic layer 120, and the organic EL element 310 in this order. However, from the viewpoint of effectively suppressing the reflection of outside light in the inclined direction, the image display device 300 may preferably include the linear polarizer 210, the second optically anisotropic layer 120, the first optically anisotropic layer 110, and the organic EL element 310 in this order, as shown in FIG. 3.

The organic EL element 310 includes a transparent electrode layer, a light-emitting layer, and an electrode layer in this order, and the light-emitting layer may generate light by applying an electric voltage from the transparent electrode layer and the electrode layer. Examples of the material constituting the organic light-emitting layer may include a polyparaphenylene vinylene-based material, a polyfluorene-based material, and a polyvinylcarbazole-based material. In addition, the light-emitting layer may have a layered body of a plurality of layers having different emission colors, or a mixed layer in which a layer of a certain dye is doped with a different dye. Furthermore, the organic EL device 310 may include a functional layer such as a hole injection layer, a hole transport layer, an electron injection layer, an electron transport layer, an equipotential surface forming layer, a charge generating layer, or the like.

The image display device 300 can suppress reflection of outside light on a display surface 300U. Specifically, when light enters from the outside of the device, only a part of the light being linearly polarized light passes through the linear polarizer 210 and then passes through the optically anisotropic layered body 100, and is therefore converted to circularly polarized light. The circularly polarized light is reflected by a light reflective component in the display device (e.g., a reflective electrode (not shown) in the organic EL element 310) and again passes through the optically anisotropic layered body 100. Therefore, the circularly polarized light is converted to linearly polarized light having a vibration direction orthogonal to the vibration direction of the incident linearly polarized light, and the linearly polarized light does not pass through the linear polarizer 210. Herein, the vibration direction of linearly polarized light means the vibration direction of electric field of linearly polarized light. As a result, the function of suppressing reflection is achieved.

Further, the optically anisotropic layered body 100 has specific optical characteristics, and therefore the image display device 300 can exhibit the function of suppressing reflection not only in the front direction of the display surface 300U but also in the inclined direction with respect to the display surface 300U. This makes it possible to suppress coloring of the display surface 300U caused by reflected light. Therefore, the image display device 300 can effectively suppress reflection of outside light in both the front direction and the inclined direction of the display surface 300U, to thereby suppress coloring.

The degree of the coloring may be evaluated by a color difference $\Delta E^{*}ab$ between a chromaticity of the display surface 300U measured by observation from an inclined direction and a chromaticity of a black color-displayed surface 300U on which reflection does not occur. The chromaticity may be determined by measuring a spectrum of light reflected by the display surface 300U, multiplying the spectrum by spectral sensitivity of the human eye (color-matching function) to determine tristimulus values X, Y, and Z, and calculating a chromaticity ($a^{*}$, $b^{*}$, $L^{*}$) therefrom. The color difference $\Delta E^{*}ab$ may be determined by the following formula (X) from a chromaticity ($a0^{*}$, $b0^{*}$, $L0^{*}$) when the display surface 300U is not exposed to outside light and a chromaticity ($a1^{*}$, $b1^{*}$, $L1^{*}$) when the display surface 300U is exposed to outside light.

$$\Delta E^{*}ab = \sqrt{(L1^{*}-L0^{*})^2 + (a1^{*}-w0^{*})^2 + (b1^{*}-b0^{*})^2} \quad (X)$$

The coloring of the display surface 300U caused by reflected light may generally vary depending on the azimuth angle of an observation direction. Therefore, when the display surface 300U is observed from an inclined direction, a chromaticity to be measured may vary depending on the azimuth angle of an observation direction, and thus a color difference $\Delta E^{*}ab$ may also vary. When the degree of coloring when the display surface 300U is observed from an inclined direction is evaluated as described above, the evaluation of coloring is preferably performed on the basis of the average value of color differences $\Delta E^{*}ab$ obtained by observation from a plurality of azimuth angle directions. Specifically, color differences $\Delta E^{*}ab$ are measured at intervals of 5° in an azimuth angle direction within the range of an azimuth angle ϕ of 0° or more and less than 360° (see FIG. 4), and the degree of coloring is evaluated on the basis of the average value of the measured color differences $\Delta E^{*}ab$ (average color difference). Small value of the average color difference is indicative of small degree of coloring of the display surface 300U when the display surface 300U is observed from an inclined direction.

EXAMPLES

Hereinafter, the present invention will be specifically described by illustrating Examples. However, the present invention is not limited to the Examples described below. The present invention may be optionally modified for implementation without departing from the scope of claims of the present invention and its equivalents. In the following description, "%" and "part" representing quantity are on the basis of weight, unless otherwise specified. The operation described below was performed under the conditions of normal temperature and normal pressure in the atmospheric air unless otherwise specified.

[Evaluation Methods]

(Phase Difference Property of Film to be Evaluated)

From the film to be evaluated was cut out an A4-size sample having a long side being parallel to the lengthwise direction of the film, and a short side being parallel to the width direction of the film.

The sample was bonded to one surface of an optically isotropic glass plate with the use of a hand application roller. The sample and the glass plate were bonded together via a tackiness agent layer ("CS9621T" manufactured by Nitto Denko Corporation). The glass plate had a size of 75 mm×25 mm. The bonding was performed such that the long side of the glass plate was parallel to the long side of the sample. The sample extending off the edge of the glass plate was trimmed with a cutter. In this manner, a phase difference plate for measurement was obtained which had a layer structure of (glass plate)/(tackiness agent layer)/(film to be evaluated).

When the phase difference property of an optically anisotropic layer formed on a certain film (substrate film) was measured, a phase difference plate for measurement was prepared by the following method.

An optically anisotropic layer to be evaluated formed on a film was bonded to a glass slide having a tackiness agent (tackiness agent: "CS9621T" manufactured by Nitto Denko Corporation). Then, the film was peeled off to obtain a phase difference plate for measurement.

The phase difference plate for measurement thus obtained was used to measure the in-plane retardations Re(450), Re(550), Re(590), and Re(650) at wavelengths of 450 nm, 550 nm, 590 nm, and 650 nm, the Rth(450), Rth(550), Rth(590), and Rth(650) at wavelengths of 450 nm, 550 nm, 590, and 650 nm, and the slow axis direction of the film to be evaluated with the use of a phase difference measuring device ("AxoScan" manufactured by Axometrics). Then, the value of Re(450)/Re(550) and the value of Re(650)/Re(550) or the value of Rth(450)/Rth(550) and the value of Rth(650)/Rth(550) of the film to be valuated were determined.

The in-plane retardation Re, the thickness-direction retardation Rth, and the NZ factor of the optically anisotropic layered body were determined by calculation from the optical property values of a first optically anisotropic layer and a second optically anisotropic layer.

(Method for Calculating Color Difference $\Delta E^*Ab$ by Simulation)

The following evaluation model including a circularly polarizing plate produced in each of Examples and Comparative Examples was formed using "LCD Master" manufactured by Shintech as software for simulation.

In the evaluation model for simulation, a structure was set in which a reflection surface of a mirror having a planar reflection surface was bonded to a first optically anisotropic layer-side surface of the circularly polarizing plate. Therefore, in this evaluation model, a structure was set in which a polarizing film, a tackiness layer, a second optically anisotropic layer, a tackiness layer, a first optically anisotropic layer, and a mirror were provided in this order from a viewing side. Further, in this evaluation model, an ideal mirror capable of specularly reflecting incident light at a reflectance of 100% was set as the mirror, and an ideal polarizing film that allows the entirety of linearly polarized light having a vibration direction parallel to a certain direction to pass therethrough and that completely blocks linearly polarized light having a vibration direction perpendicular to that certain direction was set as a polarizing film.

Figure 4:
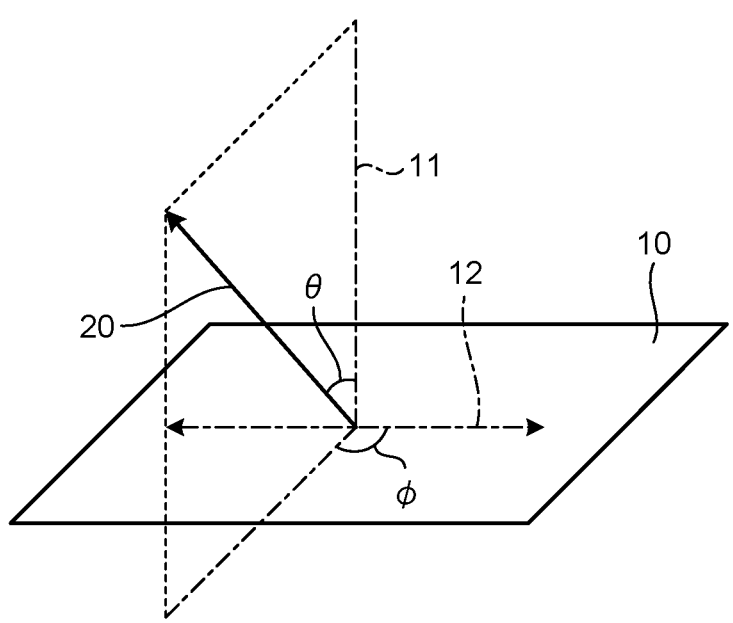
FIG. 4 is a perspective view schematically showing a state of an evaluation model set for calculation of chromaticity in a simulation in Examples and Comparative Examples.

FIG. 4 is a perspective view schematically showing a state of the evaluation model set for calculation of chromaticity in a simulation in Examples and Comparative Examples.

As shown in FIG. 4, a chromaticity observed when a reflecting surface 10 of the mirror irradiated with a D65 light source (not shown) was viewed from an observation direction 20 having a polar angle θ of 60° with respect to the reflecting surface 10 was calculated. Herein, the polar angle θ represents an angle formed with respect to a normal direction 11 of the reflecting surface 10. Further, a chromaticity observed without irradiation with the light source was calculated separately. Then, a color difference $\Delta E^*ab$ was determined using the above-described formula (X) from the chromaticity (i) observed with irradiation with the light source and the chromaticity (ii) observed without irradiation with the light source.

The calculation of the color difference $\Delta E^*ab$ was performed by shifting the observation direction 20 at intervals of 5° in an azimuth angle direction within the range of an azimuth angle φ of 0° or more and less than 360°. Herein, the azimuth angle φ represents an angle formed by a direction parallel to the reflecting surface 10 with respect to a reference direction 12 parallel to the reflecting surface 10. The average of calculated color differences $\Delta E^*ab$ was calculated to obtain an average color difference.

Further, a chromaticity observed when the reflecting surface 10 was viewed from an observation direction having a polar angle θ of 0° (i.e., from the normal direction 11) was calculated, and a chromaticity observed without irradiation with the light source was calculated separately. Then, a color difference $\Delta E^*ab$ was determined by the same manner as that when the reflecting surface 10 was viewed from an observation direction having a polar angle θ of 60°.

(Method for Evaluating Reflection Brightness and Coloring by Visual Observation)

A polarizing plate incorporated in "AppleWatch" (registered trademark) manufactured by Apple Inc. was peeled off, and the display surface thereof and a surface of the first optically anisotropic layer of the polarizing plate to be evaluated were bonded together via a tackiness layer ("CS9621" manufactured by Nitto Denko Corporation). The display surface was observed from the direction at a polar angle θ of 0° (front direction) and all directions at a polar angle θ of 60° (inclined directions) when a screen was in a white display state (state where white color was displayed on the entire screen). A lower brightness and a lower degree of coloring due to reflection of outside light during observation are regarded as better results.

A large number of observers performed the evaluation, and each of the observers ranked the results of all experimental examples (Examples and Comparative Examples) in the order from the best evaluation and gave a score corresponding to the ranking (first place: 1 point, second place: 2 points, . . . last place: 5 points). The totals of the scores of the experimental examples given by the respective observers were ranked in ascending order of score, that is, in the order from the best evaluation and rated as A, B, C, D, and E from a low score group within the range of the scores. A lower-score group is the group of higher evaluation.

(Method for Evaluating Color Shift after Heating Test)

The polarizing plate to be evaluated was bonded to "AppleWatch" manufactured by Apple Inc. by the same manner as that of the method for evaluating reflection brightness and coloring by visual observation. The screen was made in a black display state (state where black color was displayed on the entire screen) and color tone thereof was observed from all directions at a polar angle of 60°. Herein, a direction parallel to the absorption axis of the polarizing plate was defined as an azimuth angle of 0°, and a direction perpendicular to the display surface was defined as a polar angle of 0°.

Then, the polarizing plate to be evaluated was removed and subjected to a heating test by allowing it to stand in an environment at 85° C. for 250 hours. Then, the polarizing plate was again bonded to the display surface, and the color tone of the screen was observed by the same manner as that before the heating test. When the color tone observed after the heating test was not changed or was only slightly changed as compared with that before the heating test, the polarizing plate was evaluated as "good", and when the color tone was significantly changed, the polarizing plate was evaluated as "not good".

Production Example 1-1

100.0 parts by weight of triacetyl cellulose, 10.0 parts by weight of a plasticizer (polyester oligomer), 403.0 parts by weight of methylene chloride, and 60.2 parts by weight of methanol were mixed to prepare a solution containing triacetyl cellulose. The solution was cast onto a band of a band casting machine and dried to form a film, and the film was peeled off from the band by a peeling drum to obtain a film C1 made of a triacetyl cellulose resin. The film C1 had a thickness of 100 μm. The retardations of the film C1 were measured by the above-described method. The relationship among nx, ny, and nz derived from the measured values of Re and Rth and the definitions of nx, xy, nz, and NZ factor was nx=ny>nz.

Production Example 1-2

(Step A. Production of Pre-Stretch Film Formed of Cycloolefin Resin)

A monolayer film forming apparatus was prepared. Pellets of a cycloolefin resin ("ZEONOR 1420" manufactured by ZEON Corporation, glass transition temperature: 140° C.) as a resin containing an alicyclic structure-containing polymer were charged into a single screw extruder equipped with a double flight-type screw of the film forming apparatus, melted at 260° C., passed through a leaf disk-type polymer filter having an aperture size of 10 μm, and extruded from a die (surface roughness Ra of die lip: 0.1 μm) adjusted to a temperature of 260° C. to be molded into a film shape. The molded film-shaped melted resin was cast onto a cast roll having a surface temperature adjusted to 110° C., and was then passed through a gap between two cooling rolls having a surface temperature adjusted to 50° C. The resin was cooled and solidified on the cast roll to obtain a pre-stretch film. In this operation, the thickness of the pre-stretch film was adjusted in a range of 30 to 70 μm by adjusting the rotation speed of the cast roll so that a film C2 having properties shown in the following Table 1 was obtained.

(Step B. Production of Phase Difference Film)

The obtained pre-stretch film was subjected to free-end uniaxial stretching to obtain an intermediate film. Further, this intermediate film was subjected to free-end uniaxial stretching in a direction perpendicular to a first stretching direction to obtain a film C2. Herein, conditions for each uniaxial stretching were adjusted in ranges of the stretching temperature of 140 to 150° C. and the stretching ratio of 1.1 to 1.8 times so that a film C2 having properties shown in the following Table 1 was obtained. The obtained film C2 had a thickness of 30 μm. The retardations of the film C2 were measured by the above-described method.

The relationship among nx, ny, and nz derived from the measured values of Re and Rth and the definitions of nx, xy, nz, and NZ factor was nx=ny>nz.

Production Example 1-3

As a pre-stretch film, a film formed of a polycarbonate resin ("Iupilon S3000" manufactured by Mitsubishi Engineering-Plastics Corporation, glass transition temperature: 150° C.) was prepared. This pre-stretch film was subjected to free-end uniaxial stretching to obtain an intermediate film. Further, this intermediate film was subjected to free-end uniaxial stretching in a direction perpendicular to a first stretching direction to obtain a film C3. In this operation, stretching temperature and stretching ratio in each uniaxial stretching were adjusted in ranges of the stretching temperature of 150 to 160° C. and the stretching ratio of 1.5 to 5 times so that a film C3 having properties shown in the following Table 1 was obtained. The obtained film C3 had a thickness of 40 μm. The retardations of the film C3 were measured by the above-described method.

The relationship among nx, ny, and nz derived from the measured values of Re and Rth and the definitions of nx, xy, nz, and NZ factor was nx=ny>nz.

Production Example 1-4

A pre-stretch film was obtained by the same manner as that of Step A in Production Example 1-2 except that the thickness of the pre-stretch film was adjusted. The adjustment of the thickness of the pre-stretch film was performed in a range of 30 to 70 μm by adjusting the rotation speed of the cast roll so that a film C4 having properties shown in the following Table 1 was obtained. A film C4 was obtained by the same manner as that of Step B in Production Example 1-2 except that the obtained pre-stretch film was used and that conditions for each uniaxial stretching were adjusted. Adjustment of the conditions for each uniaxial stretching were performed in ranges of the stretching temperature of 140 to 150° C. and the stretching ratio of 1.1 to 1.8 times so that a film having properties shown in the following Table 1 was obtained. The obtained film C4 had a thickness of 25 μm. The retardations of the film C4 were measured by the above-described method. The relationship among nx, ny, and nz derived from the measured values of Re and Rth and the definitions of nx, xy, nz, and NZ factor was nx=ny>nz.

Production Example 1-5

68 parts of a polymerizable liquid crystal compound ("LC242" manufactured by BASF, compound represented by the following formula (LC1)), 29 parts of a compound represented by the following formula (C1), 3 parts of a photopolymerization initiator ("Irgacure 184" manufactured by BASF), and 400 parts of methyl ethyl ketone were mixed to prepare a coating liquid (LC1) as a liquid crystal composition.

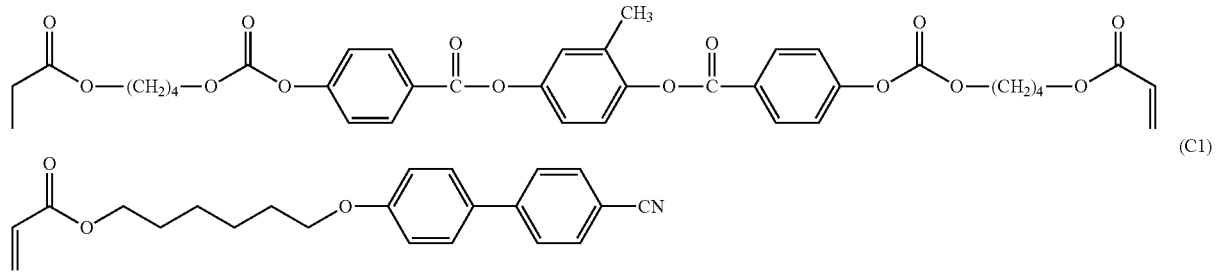

As a substrate film, an unstretched film formed of a resin containing an alicyclic structure-containing polymer (manufactured by ZEON Corporation, glass transition temperature (Tg) of resin: 163° C., thickness: 100 µm) was prepared. The substrate film was subjected to a corona treatment (output power: 0.2 kW, electrode width: 1600 mm, treatment speed: 20 m/min). The coating liquid (LC1) was applied onto the surface of the substrate film having been subjected to the corona treatment using a bar coater to form a coating liquid layer.

The coating liquid layer was subjected to a drying treatment and an orientation treatment by heating in an oven at 110° C. for 2.5 minutes to obtain a liquid crystal composition layer. Then, the liquid crystal composition layer was irradiated with ultraviolet rays in a nitrogen atmosphere at an integrated illuminance of 100 mJ/cm$^2$ (irradiation intensity: 10 mW/cm$^2$, irradiation time: 10 seconds) or more to polymerize the polymerizable liquid crystal compound in the liquid crystal composition. In this manner, an optically anisotropic transfer body was obtained which included the substrate film and a first optically anisotropic layer C5 having a thickness of 0.5 µm. The retardations of the first optically anisotropic layer C5 were measured by the above-described method.

The relationship among nx, ny, and nz derived from the measured values of Re and Rth and the definitions of nx, xy, nz, and NZ factor was nz>nx=ny.

Production Example 2-1

(Step A. Production of Resin R1 as Blended Resin p1)

60 parts by weight of syndiotactic polystyrene ("130-ZC" manufactured by Idemitsu Kosan Co., Ltd., glass transition temperature: 98° C., crystallization temperature: 140° C.) and 40 parts by weight of poly(2,6-dimethyl-1,4-phenyleneoxide) (Aldrich, Catalog No. 18242-7) were kneaded by a twin screw extruder to obtain pellets of a transparent resin R1 as a blended resin p1. The obtained resin R1 had a glass transition temperature of 141° C. The resin R1 has a negative intrinsic birefringence value.

(Step B. Production of Pre-Stretch Film)

A film forming apparatus for two-material two-layer co-extrusion molding (a molding apparatus of a type being capable of forming a film having a two-layer structure using two types of resins) was prepared which had single screw extruders equipped with a double flight-type screw. The pellets of the resin R1 were charged into one of the single screw extruders of the film forming apparatus and melted. Pellets of an impact resistant polymethyl methacrylate resin R2 ("Sumipex (registered trademark) HT55X" manufactured by Sumitomo Chemical Company, Limited) were charged into the other single screw extruder of the film forming apparatus and melted.

The melted resin R1 at 290° C. was passed through a leaf disk-type polymer filter having an aperture size of 10 µm, and then supplied into one of manifolds of a multi-manifold die (surface roughness Ra of die lip: 0.1 µm). The melted resin R2 at 260° C. was passed through a leaf disk-type polymer filter having an aperture size of 10 µm, and then supplied into the other manifold of the multi-manifold die.

The resin R1 and the resin R2 were co-extruded at 280° C. through the multi-manifold die to be molded into a film shape. The molded film-shaped melted resin was cast onto a cast roll having a surface temperature adjusted to 110° C., and was then passed through a gap between two cooling rolls having a surface temperature adjusted to 50° C. The resin was cooled and solidified on the cast roll to obtain a pre-stretch film having a layer formed of the resin R1 and a layer formed of the resin R2. In this operation, the thickness of the pre-stretch film having the layer formed of the resin R1 (thickness: 50 to 100 µm) and the layer formed of the resin R2 (thickness: 50 to 100 µm) was adjusted in a range of 100 to 200 µm by adjusting the rotation speed of the cast roll so that a film Q1 having properties shown in the following Table 1 was obtained.

(Step C. Production of Film Q1)

The obtained pre-stretch film was subjected to free-end uniaxial stretching in the lengthwise direction of the pre-stretch film with the use of a longitudinal stretching machine, and then the layer formed of the resin R2 was peeled off to produce a film Q1 formed of the resin R1. In this operation, conditions for the free-end uniaxial stretching were adjusted in ranges of the stretching temperature of 134 to 148° C. and the stretching ratio of 1.3 to 2.0 times so that the film Q1 having properties shown in the following Table 1 was obtained. The obtained film Q1 had a slow axis in the width direction of the film Q1. The obtained film Q1 had a thickness of 75 µm. The retardations of the film Q1 were measured by the above-described method.

The relationship among nx, ny, and nz derived from the measured values of Re and Rth and the definitions of nx, xy, nz, and NZ factor was ny<nx=nz as described below.

From the in-plane retardation Re and the thickness-direction retardation Rth of the film Q1, Rth/Re and NZ were calculated as follows: Rth/Re=−0.5; and NZ=Rth/Re+0.5=0. From NZ=(nx−nz)/(nx−ny)=0, nx=nz is derived. From in-plane retardation Re≠0, nx>ny is derived.

Production Example 2-2

A resin R1 was produced by the same manner as that of Step A in Production Example 2-1. Then, a pre-stretch film was produced from the resin R1 and the resin R2 by the same manner as that of Step B in Production Example 2-1 except that the thickness of the pre-stretch film was adjusted. The thickness of the pre-stretch film was adjusted in a range of 100 to 200 µm by adjusting the rotation speed of the cast roll so that a film Q2 having properties shown in the following Table 1 was obtained. Then, the obtained pre-stretch film was subjected to tenter stretching in the lateral direction of the pre-stretch film by a longitudinal stretching machine, and then the layer formed of the resin R2 was peeled off to produce the film Q2 formed of the resin R1. In this operation, conditions for the tenter stretching were adjusted in ranges of the stretching temperature of 134° C. to 148° C. and the stretching ratio of 1.5 to 2.5 times so that the film Q2 having properties shown in the following Table 1 was obtained. The obtained film Q2 had a slow axis in the width direction of the film Q2. The obtained film Q2 had a thickness of 65 µm. The retardations of the film Q2 were measured by the above-described method.

The relationship among nx, ny, and nz derived from the measured values of Re and Rth and the definitions of nx, xy, nz, and NZ factor was ny<nx<nz as described below. From the in-plane retardation Re and the thickness-direction retardation Rth of the film Q2, Rth/Re and NZ were calculated as follows: Rth/Re=−0.74; and NZ=Rth/Re+0.5=−0.24. From NZ=(nx−nz)/(nx−ny)=−0.24 and nx−ny>0 derived from in-plane retardation Re≠0, nx<nz is derived.

Production Example 2-3

(Step A. Production of Resin R3)

A polycarbonate resin R3 was obtained in accordance with the method described in Synthesis Example 9 in Japanese Patent Application Laid-Open No. 2013-076982 A using 397.3 parts by weight of isosorbide, 960.1 parts by weight of 9,9-bis[4-(2-hydroxyethoxy)phenyl]fluorene, 14.6 parts by weight of polyethylene glycol (manufactured by Sanyo Chemical Industries, Ltd., number-average molecular weight: 1000), 1065.1 parts by weight of diphenyl carbonate, and $8.45 \times 10^{-3}$ parts by weight of magnesium acetate tetrahydrate as a catalyst. The resin R3 has a positive intrinsic birefringence value.

(Step B. Production of Pre-Stretch Film)

The obtained polycarbonate resin R3 was vacuum-dried at 80° C. for 5 hours and then subjected to film formation process with the use of a film forming apparatus having a single screw extruder, a T-die, a chill roll, and a winder, to thereby obtain a long-length pre-stretch film. The thickness of the pre-stretch film was adjusted in a range of 70 to 130 µm so that a film Q3 having properties shown in the following Table 1 was obtained.

(Step C. Production of Film Q3)

The obtained pre-stretch film was vacuum-dried at 100° C. for 3 days and then subjected to free-end uniaxial stretching to obtain the film Q3. In this operation, conditions for the uniaxial stitching were adjusted in ranges of the stretching temperature of 127 to 177° C. and the stretching ratio of 1.5 to 2.5 times so that the film Q3 having properties shown in the following Table 1 was obtained. The obtained film Q3 had a thickness of 70 µm. The retardations of the film Q3 were measured by the above-described method.

The relationship among nx, ny, and nz derived from the measured values of Re and Rth and the definitions of nx, xy, nz, and NZ factor was nx>ny=nz.

Example 1

The film C1 obtained as a first optically anisotropic layer in Production Example 1-1 and the film Q1 obtained as a second optically anisotropic layer in Production Example 2-1 were bonded together via a tackiness layer ("CS9621T" manufactured by Nitto Denko Corporation) to obtain an optically anisotropic layered body having a layer structure of (first optically anisotropic layer/tackiness layer/second optically anisotropic layer).

A polarizing film ("HLC2-5618S" manufactured by Sanritz Corporation) as a linear polarizer was bonded to the second optically anisotropic layer-side surface of the obtained optically anisotropic layered body via a tackiness layer ("CS9621T" manufactured by Nitto Denko Corporation). The bonding was performed so that the angle between the slow axis of the second optically anisotropic layer and the polarized light transmission axis of the polarizing film was 45°. In this manner, a circularly polarizing plate was obtained which had a layer structure of (polarizing film/tackiness layer/second optically anisotropic layer/tackiness layer/first optically anisotropic layer).

The obtained circularly polarizing plate was evaluated by the above-described methods.

Example 2

An optically anisotropic layered body and a circularly polarizing plate were produced and evaluated by the same manner as that of Example 1 except that the film C2 obtained in Production Example 1-2 was used as the first optically anisotropic layer.

Example 3

An optically anisotropic layered body and a circularly polarizing plate were produced and evaluated by the same manner as that of Example 1 except that the film C3 obtained in Production Example 1-3 was used as the first optically anisotropic layer.

Example 4

An optically anisotropic layered body and a circularly polarizing plate were produced and evaluated by the same manner as that of Example 1 except that the film C4 obtained in Production Example 1-4 was used as the first optically anisotropic layer, and the film Q2 obtained in Production Example 2-2 was used as the second optically anisotropic layer.

Comparative Example 1

A polarizing film ("HLC2-5618S" manufactured by Sanritz Corporation) as a linear polarizer was bonded to the film Q1 obtained in Production Example 2-1 as the second optically anisotropic layer via a tackiness layer ("CS9621T" manufactured by Nitto Denko Corporation). The bonding was performed so that the angle between the slow axis of the second optically anisotropic layer and the polarized light transmission axis of the polarizing film was 45°. In this manner, a circularly polarizing plate was obtained which had a layer structure of (polarizing film/tackiness layer/second optically anisotropic layer).

The obtained circularly polarizing plate was evaluated by the above-described methods.

Comparative Example 2

The surface of the optically anisotropic transfer body obtained in Production Example 1-5 on the side closer to the first optically anisotropic layer and the film Q3 obtained in Production Example 2-3 as the second optically anisotropic layer were bonded together via a tackiness layer ("CS9621T" manufactured by Nitto Denko Corporation). After that, the substrate film was peeled off to obtain an optically anisotropic layered body having a layer structure of first optically anisotropic layer/tackiness layer/second optically anisotropic layer. A circularly polarizing plate was produced and evaluated by the same manner as that of Example 1 except that the obtained optically anisotropic layered body was used.

The evaluation results of each of Examples and Comparative Examples are shown below.

In Table 1,

"SPSPPE" means a blend resin of the syndiotactic polystyrene and poly(2,6-dimethyl-1,4-phenyleneoxide) used in Production Example 2-1 and Production Example 2-2, "PC" means a polycarbonate resin, "COP" means a cycloolefin resin, "TAC" means a triacetyl cellulose resin, "LC242" means a liquid crystal composition containing "LC242" manufactured by BASF, "Re(450)" and "Rth(450)" mean an in-plane retardation and a thickness-direction retardation, respectively, at a wavelength of 450 nm.

"Re(550)" and "Rth(550)" mean an in-plane retardation and a thickness-direction retardation, respectively, at a wavelength of 550 nm.

"Re(590)" and "Rth(590)" mean an in-plane retardation and a thickness-direction retardation, respectively, at a wavelength of 590 nm.

"Re(650)" and "Rth(650)" mean an in-plane retardation and a thickness-direction retardation, respectively, at a wavelength of 650 nm.

"NZ(590)" means an NZ factor at a wavelength of 590 nm.

In Table 2,

"ΔE*ab (θ=0°)" means the color difference when observed from the polar angle θ=0°, and "Average ΔE*ab (θ=60°)" means the average color difference when observed from the polar angle θ=60°.

TABLE 1

|  | Ex. 1 | Ex. 2 | Ex. 3 | Ex. 4 | Comp. Ex. 1 | Comp. Ex. 2 |
|---|---|---|---|---|---|---|
| First optically anisotropic layer | C1 | C2 | C3 | C4 | — | C5 |
| Material | TAC | COP | PC | COP | — | LC242 |
| Re (590) | 0 | 0 | 0 | 0 | — | 0 |
| Rth (590) | 60 | 60 | 60 | 80 | — | −60 |
| Rth (450)/Rth (550) | 0.74 | 1.01 | 1.07 | 1.01 | — | 1.08 |
| Rth (650)/Rth (550) | 1.12 | 1.00 | 0.96 | 1.00 | — | 0.96 |
| Second optically anisotropic layer | Q1 | Q1 | Q1 | Q2 | Q1 | Q3 |
| Material | SPSPPE | SPSPPE | SPSPPE | SPSPPE | SPSPPE | PC |
| Re (590) | 141 | 141 | 141 | 141 | 141 | 145 |
| Rth (590) | −70.5 | −70.5 | −70.5 | −105 | −70.5 | 72.5 |
| Re (450)/Re (550) | 0.89 | 0.89 | 0.89 | 0.89 | 0.89 | 0.88 |
| Re (650)/Re (550) | | | | | | |
| Re (550) Optically anisotropic layered body | | | | | | |
| Re (590) | 140.5 | 140.5 | 140.5 | 140.5 | 140.5 | 145.0 |
| Rth (590) | −10.3 | −10.3 | −10.3 | −25.4 | −70.3 | 12.11 |
| NZ (590) | 0.43 | 0.43 | 0.43 | 0.32 | 0.00 | 0.59 |
| Re (450)/Re (550) | 0.89 | 0.89 | 0.89 | 0.89 | 0.89 | 0.88 |
| Re (650)/Re (550) | | | | | | |

TABLE 2

|  | Ex. 1 | Ex. 2 | Ex. 3 | Ex. 4 | Comp. Ex. 1 | Comp. Ex. 2 |
|---|---|---|---|---|---|---|
| ΔE*ab (θ = 0°) | 10.34 | 10.34 | 10.37 | 10.34 | 10.34 | 11.12 |
| Visual observation (θ = 0°) | A | A | A | A | A | A |
| Average ΔE*ab (θ = 60°) | 12.70 | 12.7 | 12.88 | 13.39 | 22.88 | 13.37 |
| Visual observation (θ = 60°) | A | A | A | B | E | B |
| Color shift after heating test (85° C.-250 h) | Good | Good | Good | Good | Good | Not good |

As can be seen from the results, as compared with the image display device having the polarizing plate of Comparative Example 1, the image display devices each having the polarizing plate of each of Examples 1 to 4 using the optically anisotropic layered body and the linear polarizer in combination resulted in suppression to the same level of coloring of the display surface upon viewing the display surface from a front direction, and resulted in suppression to a significant level of coloring of the display surface upon viewing the display surface from an inclined direction. Further, as can be seen from the results, as compared with the image display device having the polarizing plate of Comparative Example 2 including a first optically anisotropic layer satisfying nz>nx=ny (i.e., a first optically anisotropic layer functioning as a positive C plate), the image display devices each having the polarizing plate of each of Examples 1 to 3 resulted in suppression to a better level of coloring of the display surface upon viewing the display surface from a front direction and an inclined direction, and resulted in suppression of color shift after the heating test.

The results indicate that the optically anisotropic layered body, the polarizing plate, and the image display device according to the present invention make it possible to achieve an image display device in which coloring of a display surface upon viewing the display surface from a front direction and an inclined direction is suppressed without the necessity of use of a positive C plate. Therefore, the optically anisotropic layered body and the polarizing plate according to the present invention can be produced at lower cost as compared with an optically anisotropic layered body and a polarizing plate which include a positive C plate, and can suppress a change in the color tone of a display surface upon viewing from an inclined direction after the heating test.

REFERENCE SIGN LIST 100 optically anisotropic layered body
110 first optically anisotropic layer
120 second optically anisotropic layer
200 polarizing plate
210 linear polarizer
300 image display device
310 organic EL element

The invention claimed is:

1. A polarizing plate comprising:
an optically anisotropic layered body; and
a linear polarizer, wherein
an angle formed by a slow axis of the optically anisotropic layered body with respect to a polarization absorption axis of the linear polarizer being 45°±5°,
the optically anisotropic layered body includes a first optically anisotropic layer and a second optically anisotropic layer,
the first optically anisotropic layer satisfies the following formulae (1) and (5),
the second optically anisotropic layer satisfies the following formulae (2) and (6),
the optically anisotropic layered body satisfies the following formulae (3) and (4), and
an in-plane retardation Re1 of the first optically anisotropic layer is 0 nm or more and 3 nm or less:

$$nx1 \geq ny1 > nz1 \quad \text{Formula (1),}$$

$$ny2 < nx2 \leq nz2 \quad \text{Formula (2),}$$

$$Re(450) < Re(550) < Re(650) \quad \text{Formula (3),}$$

$$0 < NZ < 1.0 \quad \text{Formula (4),}$$

$$Rth1(450) < Rth1(550) < Rth1(650) \quad \text{Formula (5), and}$$

$$Re2(450) < Re2(550) < Re2(650) \quad \text{Formula (6),}$$

wherein
nx1 represents a refractive index in a direction in which a maximum refractive index is given among in-plane directions of the first optically anisotropic layer, ny1 represents a refractive index in another in-plane direction of the first optically anisotropic layer being orthogonal to the direction giving nx1, and nz1 represents a refractive index in a thickness direction of the first optically anisotropic layer,
nx2 represents a refractive index in a direction in which a maximum refractive index is given among in-plane directions of the second optically anisotropic layer, ny2 represents a refractive index in another in-plane direction of the second optically anisotropic layer being orthogonal to the direction giving nx2, and nz2 represents a refractive index in a thickness direction of the second optically anisotropic layer,
Re (450), Re (550), and Re (650) represent in-plane retardations Re of the optically anisotropic layered body at wavelengths of 450 nm, 550 nm, and 650 nm, respectively,
Rth1 (450), Rth1 (550), and Rth1 (650) represent thickness-direction retardations Rth of the first optically anisotropic layer at wavelengths of 450 nm, 550 nm, and 650 nm, respectively,
Re2 (450), Re2 (550), and Re2 (650) represent in-plane retardations Re of the second optically anisotropic layer at wavelengths of 450 nm, 550 nm, and 650 nm, respectively, and
NZ represents an NZ factor of the optically anisotropic layered body.

2. An image display device comprising the polarizing plate according to claim 1 and an organic electroluminescent element, wherein
the linear polarizer, the optically anisotropic layered body, and
the organic electroluminescent element are disposed in this order.

3. The polarizing plate according to claim 1, wherein the second optically anisotropic layer includes a layer formed of a resin containing a polyphenylene ether and a polystyrene-based polymer having a syndiotactic structure.

4. The polarizing plate according to claim 3, wherein a weight ratio of the polyphenylene ether relative to the polystyrene-based polymer having a syndiotactic structure is 35/65 or more, and 45/55 or less.

5. The polarizing plate according to claim 1, wherein the first optically anisotropic layer is a layer obtained by stretching a layer containing a resin having a positive intrinsic birefringence value.

* * * * *